US 7,998,536 B2

(12) United States Patent
Yim et al.

(10) Patent No.: US 7,998,536 B2
(45) Date of Patent: *Aug. 16, 2011

(54) SILICON PRECURSORS TO MAKE ULTRA LOW-K FILMS OF K<2.2 WITH HIGH MECHANICAL PROPERTIES BY PLASMA ENHANCED CHEMICAL VAPOR DEPOSITION

(75) Inventors: Kang Sub Yim, Santa Clara, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 768 days.

This patent is subject to a terminal disclaimer.

(21) Appl. No.: 11/777,185

(22) Filed: Jul. 12, 2007

(65) Prior Publication Data
US 2009/0017639 A1     Jan. 15, 2009

(51) Int. Cl.
| | |
|---|---|
| C23C 16/00 | (2006.01) |
| B05D 3/00 | (2006.01) |
| B29C 71/02 | (2006.01) |
| B29C 71/04 | (2006.01) |
| C04B 41/00 | (2006.01) |
| C08J 7/18 | (2006.01) |

(52) U.S. Cl. ............ 427/532; 427/248.1; 427/255.23
(58) Field of Classification Search .......... 427/248.1, 427/255.23, 532; 556/434
See application file for complete search history.

(56) References Cited

U.S. PATENT DOCUMENTS

| | | | | |
|---|---|---|---|---|
| 3,560,435 | A * | 2/1971 | Lee | ................... 528/12 |
| 5,118,530 | A |  6/1992 | Hanneman et al. | |
| 6,541,367 | B1 |  4/2003 | Mandal | |
| 6,596,655 | B1 |  7/2003 | Cheung et al. | |
| 6,897,163 | B2 * |  5/2005 | Gaillard et al. | ............... 438/778 |
| 7,122,880 | B2 | 10/2006 | Peterson et al. | |
| 7,229,934 | B2 |  6/2007 | Dubois et al. | |
| 7,297,376 | B1 * | 11/2007 | Yim et al. | ..................... 427/578 |
| 2001/0049203 | A1 | 12/2001 | Kim et al. | |
| 2002/0142579 | A1 | 10/2002 | Vincent et al. | |
| 2003/0017642 | A1 * |  1/2003 | Conti et al. | ..................... 438/99 |
| 2003/0232137 | A1 | 12/2003 | Vrtis et al. | |

(Continued)

FOREIGN PATENT DOCUMENTS
WO    WO-2005078155 A1    8/2005

OTHER PUBLICATIONS

International Search Report and Written Opinion of the International Searching Authority Dated Sep. 8, 2008 (PCT/US08/67487).

(Continued)

*Primary Examiner* — Frederick Parker
*Assistant Examiner* — Michael Wieczorek
(74) *Attorney, Agent, or Firm* — Patterson & Sheridan, L.L.P.

(57) ABSTRACT

A method for depositing a low dielectric constant film on a substrate is provided. The low dielectric constant film is deposited by a process comprising reacting one or more organosilicon compounds and a porogen and then post-treating the film to create pores in the film. The one or more organosilicon compounds include compounds that have the general structure Si—$C_X$—Si or —Si—O—$(CH_2)_n$—O—Si—. Low dielectric constant films provided herein include films that include Si—$C_X$—Si bonds both before and after the post-treatment of the films. The low dielectric constant films have good mechanical and adhesion properties, and a desirable dielectric constant.

13 Claims, 3 Drawing Sheets

U.S. PATENT DOCUMENTS

| | | | |
|---|---|---|---|
| 2004/0048960 A1* | 3/2004 | Peterson et al. | 524/261 |
| 2004/0096672 A1* | 5/2004 | Lukas et al. | 428/446 |
| 2004/0175501 A1* | 9/2004 | Lukas et al. | 427/255.28 |
| 2005/0130404 A1 | 6/2005 | Moghadam et al. | |
| 2005/0161060 A1 | 7/2005 | Johnson et al. | |
| 2005/0194619 A1* | 9/2005 | Edelstein et al. | 257/232 |
| 2005/0215072 A1* | 9/2005 | Kevwitch et al. | 438/778 |
| 2006/0071607 A1 | 4/2006 | Chen et al. | |
| 2006/0249713 A1 | 11/2006 | Peterson et al. | |
| 2006/0249818 A1 | 11/2006 | Peterson et al. | |
| 2006/0276054 A1 | 12/2006 | Lakshmanan et al. | |
| 2007/0079753 A1 | 4/2007 | Padhi et al. | |
| 2007/0117408 A1 | 5/2007 | Nguyen et al. | |
| 2007/0161256 A1* | 7/2007 | Gates et al. | 438/780 |

OTHER PUBLICATIONS

Sugahara et al., "A Proposed Organic-Silica Film for Inter-Metal-Dielectric Application." Jpn. J. Appl. Phys. vol. 38 (1999) pp. 1428-1432.

PCT International Search Report and Written Opinion dated Feb. 22, 2010, in International Application Serial No. PCT/US2009/051983.

USPTO Office Action dated Feb. 19, 2010, in U.S. Appl. No. 12/183,915.

\* cited by examiner

SILICON PRECURSORS TO MAKE ULTRA LOW-K FILMS OF K<2.2 WITH HIGH MECHANICAL PROPERTIES BY PLASMA ENHANCED CHEMICAL VAPOR DEPOSITION

BACKGROUND OF THE INVENTION

1. Field of the Invention

Embodiments of the present invention generally relate to the fabrication of integrated circuits. More particularly, embodiments of the present invention relate to a process for depositing low dielectric constant films for integrated circuits.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 90 nm and even 65 nm feature sizes, and tomorrow's facilities soon will be producing devices having even smaller feature sizes.

The continued reduction in device geometries has generated a demand for films having lower dielectric constant (k) values because the capacitive coupling between adjacent metal lines must be reduced to further reduce the size of devices on integrated circuits. In particular, insulators having low dielectric constants, less than about 4.0, are desirable. Examples of insulators having low dielectric constants include spin-on glass, fluorine-doped silicon glass (FSG), carbon-doped oxide, and polytetrafluoroethylene (PTFE), which are all commercially available.

More recently, low dielectric constant organosilicon films having k values less than about 3.0 and even less than about 2.5 have been developed. One method that has been used to develop low dielectric constant organosilicon films has been to deposit the films from a gas mixture comprising an organosilicon compound and a compound comprising thermally labile species or volatile groups and then post-treat the deposited films to remove the thermally labile species or volatile groups, such as organic groups, from the deposited films. The removal of the thermally labile species or volatile groups from the deposited films creates nanometer-sized voids in the films, which lowers the dielectric constant of the films, as air has a dielectric constant of approximately 1.

While low dielectric constant organosilicon films that have desirable low dielectric constants have been developed as described above, some of these low dielectric constant films have exhibited less than desirable mechanical properties, such as poor mechanical strength, which renders the films susceptible to damage during subsequent semiconductor processing steps. Semiconductor processing steps which can damage the low dielectric constant films include plasma-based etching processes that are used to pattern the low dielectric constant films. Ashing processes to remove photoresists or bottom anti-reflective coatings (BARC) from the dielectric films and wet etch processes can also damage the films.

Thus, there remains a need for a process for making low dielectric constant films that have improved mechanical properties and resistance to damage from subsequent substrate processing steps.

SUMMARY OF THE INVENTION

The present invention generally provides methods for depositing a low dielectric constant film. In one embodiment, the method includes introducing one or more organosilicon compounds into a chamber, wherein the one or more organosilicon compounds comprise a compound having the general structure:

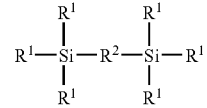

wherein each $R^1$ is independently selected from the group consisting of $CH_3$, $OCH_3$, $OC_2H_5$, $C=CH_2$, H, and OH, and $R^2$ is selected from the group consisting of $(CH_2)_a$, $C=C$, $C_6H_4$, $C=O$, $(CF_2)_b$, and combinations thereof, with a and b being independently 1 to 4, or the general structure:

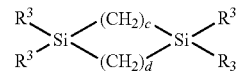

wherein each $R^3$ is independently selected from the group consisting of $CH_3$, $OCH_3$, $OC_2H_5$, $C=CH_2$, H, and OH, and c and d are independently 1 to 4. The method also includes introducing a porogen into the chamber and reacting the one or more organosilicon compounds and the porogen in the presence of RF power to deposit a low dielectric constant film on a substrate in the chamber. The low dielectric constant film is then post-treated to substantially remove the porogen from the low dielectric constant film. The post-treating may comprise a UV, e-beam, or thermal annealing treatment. The post-treated low dielectric constant film comprises $Si-C_x-Si$ bonds.

In another embodiment, a method for depositing a low dielectric constant film comprises introducing one or more organosilicon compounds into a chamber, wherein the one or more organosilicon compounds comprises a compound having the general structure:

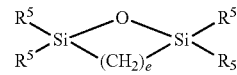

wherein each $R^5$ is independently selected from the group consisting of $CH_3$, $OCH_3$, $OC_2H_5$, $C=CH_2$, H, and OH, and e is 1 to 3, or the general structure

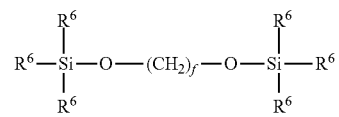

wherein each $R^6$ is independently selected from the group consisting of $CH_3$, $OCH_3$, $OC_2H_5$, $C=CH_2$, H, and OH, and f is 1 to 4. The method also includes introducing a porogen into the chamber and reacting the one or more organosilicon compounds and the porogen in the presence of RF power to deposit a low dielectric constant film on a substrate in the chamber. The low dielectric constant film is then post-treated to substantially remove the porogen from the low dielectric constant film. The post-treating may comprise a UV, e-beam, or thermal annealing treatment.

In an additional embodiment, a method for depositing a low dielectric constant film comprises introducing one or more organosilicon compounds into a chamber, wherein the one or more organosilicon compounds comprises bis(triethoxysilyl)methane, introducing a porogen into the chamber, reacting the one or more organosilicon compounds and the porogen in the presence of RF power to deposit a low dielectric constant film on a substrate in the chamber, and then post-treating the low dielectric constant film to substantially remove the porogen from the low dielectric constant film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method of depositing a low dielectric constant film. The low dielectric constant film comprises silicon, oxygen, and carbon. The film also comprises nanometer-sized pores. The low dielectric constant film has a dielectric constant of about 3.0 or less, preferably about 2.5 or less, such as between about 2.0 and 2.2. The low dielectric constant film may have an elastic modulus of at least about 6 GPa. The low dielectric constant film may be used as an intermetal dielectric layer, for example. A method of depositing a low dielectric constant film according to an embodiment of the invention will be described briefly with respect to FIG. 1 and then further described below.

Figure 1:
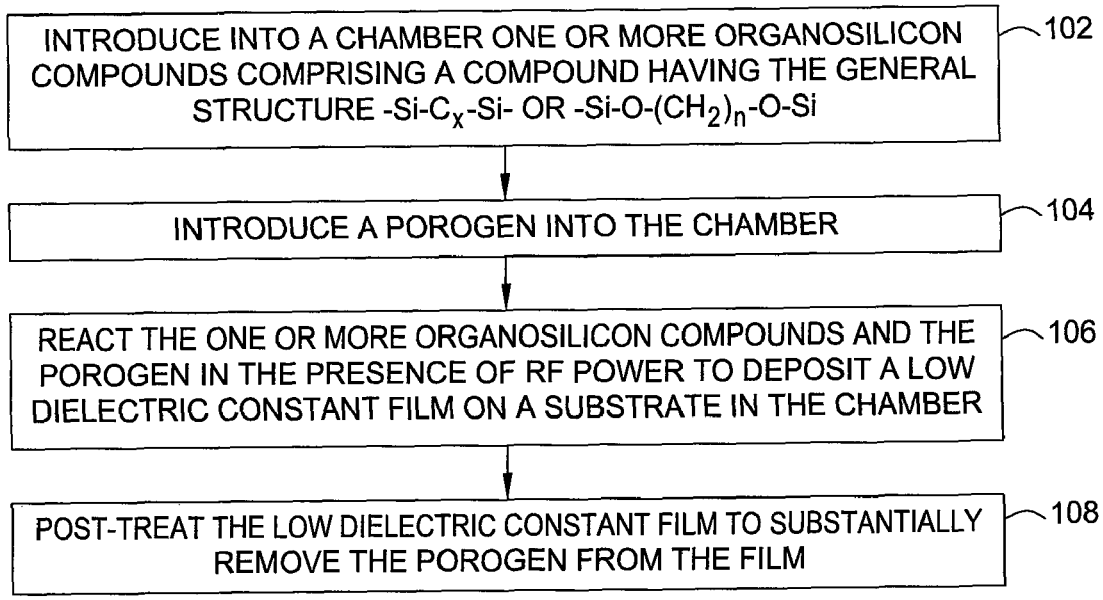
FIG. 1 is a flow diagram illustrating an embodiment of the invention.

FIG. 1 is a process flow diagram summarizing an embodiment of the invention. In step 102, one or more organosilicon compounds are introduced into a chamber. The one or more organosilicon compounds comprise a compound having the general structure —Si—$C_x$—Si—, wherein x is between 1 and 4 or the general structure —Si—O—$(CH_2)_n$—O—Si—, wherein n is between 1 and 4. In step 104, a porogen is introduced into the chamber. In step 106, the one or more organosilicon compounds and the porogen are reacted in the presence of RF power to deposit a low dielectric constant film on a substrate in the chamber. In step 108, the low dielectric constant film is post-treated to substantially remove the porogen from the low dielectric constant film.

The chamber into which the one or more organosilicon compounds and the porogen are introduced may be a plasma enhanced chemical vapor deposition (PECVD) chamber. The plasma for the deposition process may be generated using constant radio frequency (RF) power, pulsed RF power, high frequency RF power, dual frequency RF power, or combinations thereof. An example of a PECVD chamber that may used is a PRODUCER® chamber, available from Applied Materials, Inc. of Santa Clara, Calif. However, other chambers may be used to deposit the low dielectric constant film.

Returning to step 102, the compound having the general structure —Si—$C_x$—Si— includes compounds that have the general structure:

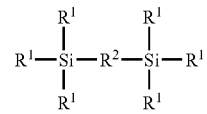

wherein each $R^1$ is independently selected from the group consisting of $CH_3$, $OCH_3$, $OC_2H_5$, C=$CH_2$, H, and OH, and $R^2$ is selected from the group consisting of $(CH_2)_a$, C=C, $C_6H_4$, C=O, $(CF_2)_b$, and combinations thereof, with a and b being 1 to 4, and the general structure:

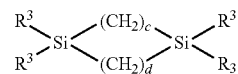

wherein each $R^3$ is independently selected from the group consisting of $CH_3$, $OCH_3$, $OC_2H_5$, C=$CH_2$, H, and OH, and c and d are independently 1 to 4. As defined herein, values for R groups and other groups that are independently selected may be the same or different than the other groups.

An example of a compound having the general structure:

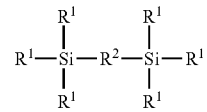

is bis(triethoxysilyl)methane ($C_{13}H_{32}O_6Si_2$).

An example of a compound having the general structure:

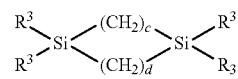

is tetramethyl-1,3-disilacyclobutane ($C_6H_{16}Si_2$).

Other compounds that have the general structure —Si—$C_x$—Si— include compounds that have the general structure:

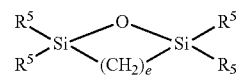

wherein each $R^5$ is independently selected from the group consisting of $CH_3$, $OCH_3$, $OC_2H_5$, C=$CH_2$, H, and OH, and e is 1 to 3. An example of such a compound is tetramethyl-2, 5-disila-1-oxacyclopentane tetramethyldisilafuran ($C_6H_{16}OSi_2$).

The one or more organosilicon compounds having the general structure —Si—O—$(CH_2)_n$—O—Si— may comprise compounds having the structure

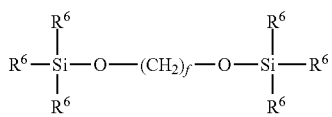

wherein each $R^6$ is independently selected from the group consisting of $CH_3$, $OCH_3$, $OC_2H_5$, $C=CH_2$, H, and OH, and f is 1 to 4. An example of such a compound is bis(trimethylsiloxy)ethane ($C_8H_{22}O_2Si_2$).

By using organosilicon compounds that comprise Si—$C_x$—Si bonds and the processing conditions described herein, low dielectric constant films that comprise Si—$C_x$—Si bonds (with x being between 1 and 4) both before and after post-treatment may be obtained. Depending on the organosilicon compounds used, the films may also comprise Si—O—Si bonds. Films comprising Si—$C_x$—Si bonds are desirable, as it has been observed that films with high Si—$C_x$—Si/Si—$CH_3$ ratios have improved ashing resistance, adhesion, and thermal conductivity properties compared to films having more Si—$CH_3$ bonds.

The one or more organosilicon compounds may also comprise organosilicon compounds that do not include the general structures described above. For example, the one or more organosilicon compounds may include methyldiethoxysilane (MDEOS), tetramethylcyclotetrasiloxane (TMCTS), octamethylcyclotetrasiloxane (OMCTS), trimethylsilane (TMS), pentamethylcyclopentasiloxane, hexamethylcyclotrisiloxane, dimethyldisiloxane, tetramethyldisiloxane, hexamethyldisiloxane (HMDS), 1,3-bis(silanomethylene)disiloxane, bis (1-methyldisiloxanyl)methane, bis(1-methyldisiloxanyl) propane, hexamethoxydisiloxane (HMDOS), dimethyldimethoxysilane (DMDMOS), or dimethoxymethylvinylsilane (DMMVS).

Returning to step 104, the porogen is a compound that comprises thermally labile groups. The thermally labile groups may be cyclic groups, such as unsaturated cyclic organic groups. The term "cyclic group" as used herein is intended to refer to a ring structure. The ring structure may contain as few as three atoms. The atoms may include carbon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. In one embodiment, the cyclic group is bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. The porogen may comprise a cyclic hydrocarbon compound. Some exemplary porogens that may be used include norbornadiene (BCHD, bicycle(2.2.1)hepta-2, 5-diene), alpha-terpinene (ATP), vinylcyclohexane (VCH), phenylacetate, butadiene, isoprene, cyclohexadiene, 1-methyl-4-(1-methylethyl)-benzene (cymene), 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

As shown in step 106, the one or more organosilicon compounds and the porogen are reacted in the presence of RF power to deposit a low dielectric constant film on a substrate in the chamber. One or more porogens may be reacted with the one or more organosilicon compounds. The porogen reacts with the one or more organosilicon compounds to deposit a film that retains the thermally labile groups therein. Post-treating the film, as described in step 108, results in the decomposition and evolution of the porogens and/or the thermally labile groups from the film, resulting in the formation of voids or nanometer-sized pores in the film.

The one or more organosilicon compounds may be introduced into the chamber at a flow rate between about 10 mgm and about 5000 mgm. The porogen may be introduced into the chamber at a flow rate between about 10 mgm and about 5000 mgm. Optionally, an oxidizing gas, such as $O_2$, $N_2O$, $CO_2$, or combinations thereof, may be introduced into the chamber at a flow rate between about 0 sccm and about 10000 sccm and reacted with the one or more organosilicon compounds and the porogen. A dilution or carrier gas, such as helium, argon, or nitrogen, may also be introduced into the chamber at a flow rate between about 10 sccm and about 10000 sccm.

The flow rates described above and throughout the instant application are provided with respect to a 300 mm chamber having two isolated processing regions, such as a PRODUCER® chamber, available from Applied Materials, Inc. of Santa Clara, Calif. Thus, the flow rates experienced per each substrate processing region are half of the flow rates into the chamber.

Although the introduction of the one or more organosilicon compounds and the introduction of the porogen into the chamber are shown sequentially as steps 102 and 104, the introduction of the one or more organosilicon compounds and the introduction of the porogen may be performed simultaneously. However, in a preferred embodiment, the one or more organosilicon compounds are introduced into the chamber before the porogen. In this embodiment, the one or more organosilicon compounds are introduced into the chamber at a first flow rate and then ramped up to a second flow rate. The porogen is introduced into the chamber at a third flow rate and then ramped up to a fourth flow rate. The one or more organosilicon compounds are ramped up to the second flow rate before the porogen is ramped up to the fourth flow rate.

Figure 2:
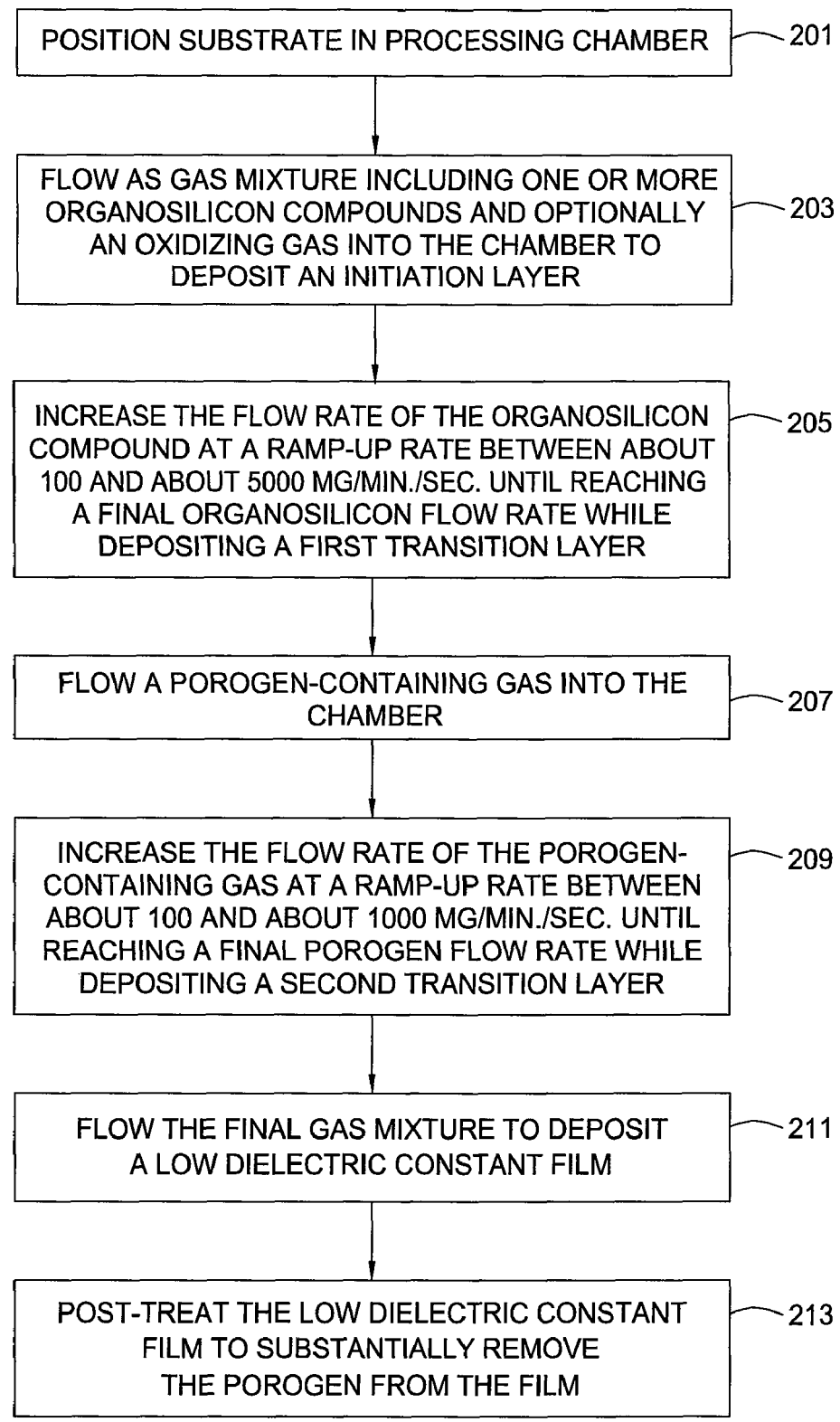
FIG. 2 is a flow diagram illustrating another embodiment of the invention.

FIG. 2 is a process flow diagram illustrating a method of depositing a low dielectric constant film according to an embodiment in which the one or more organosilicon compounds are introduced into the chamber before the porogen. In step 201, a substrate is positioned on a substrate support in a processing chamber capable of performing PECVD. In step 203, a gas mixture having a composition including one or more organosilicon compounds and optionally one or more oxidizing gases is introduced into the chamber through a gas distribution plate of the chamber, such as a showerhead. A radio-frequency (RF) power is applied to an electrode, such as the showerhead, in order to provide plasma processing conditions in the chamber. The gas mixture is reacted in the chamber in the presence of RF power to deposit an initiation layer comprising a silicon oxide layer that adheres strongly to the underlying substrate.

In step 205, the flow rate of the one or more organosilicon compounds is increased at a ramp-up rate between about 100 mg/min/sec and about 5000 mg/min/sec, preferably, between about 1000 mg/min/sec and about 2000 mg/min/sec, in the presence of the RF power, to deposit a first transition layer until reaching a predetermined organosilicon compound gas mixture. The ramp-up of the flow rate conditions is performed such that variation in DC bias of the gas distribution plate is less than 60 volts, preferably less than 30 volts, to avoid plasma induced damage (PID).

In step 207, while keeping the predetermined organosilicon compound gas mixture constant, a gas mixture having a composition including a porogen is introduced into the chamber through the gas distribution plate. In step 209, the flow rate of the porogen is increased at a ramp-up rate between about 100 mg/min/sec and about 5000 mg/min/sec, preferably, between about 200 mg/min/sec and about 1000 mg/min/sec, to deposit a second transition layer until reaching a predetermined final gas mixture.

In step 211, the predetermined final gas mixture, i.e., the final gas mixture having a composition including the one or more organosilicon compounds and the porogen, is reacted in the chamber in the presence of RF power to deposit a final layer that is a low dielectric constant film. Upon completion of the deposition, the RF power is terminated. The chamber pressure is maintained during the RF power termination, such as by not opening the chamber throttle valve. Not wishing to be bound by theory, it is believed that by separating the ramp-up rates of the organosilicon compounds and the porogen compound, a more stable and manufacturable process can be obtained, yielding dielectric films with less defect issues, such as particle adders.

In step 213, the low dielectric constant film is post-treated to substantially remove the porogen from the low dielectric constant film.

Figure 3:
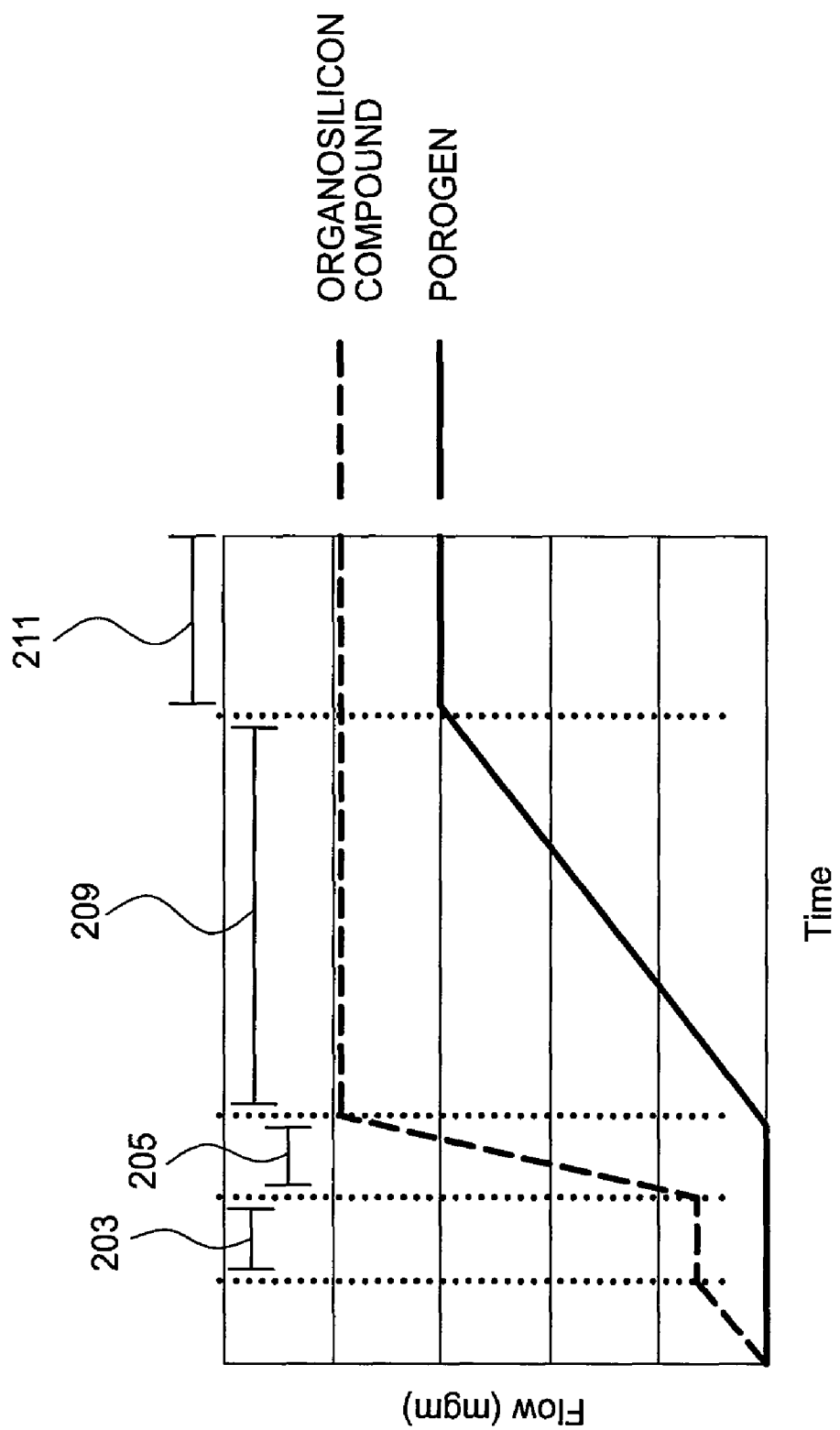
FIG. 3 is a graph of the flow rates of the one or more organosilicon compounds and the porogen according to an embodiment of the invention.

FIG. 3 is a graph illustrating the flow rates of the one or more organosilicon compounds and the porogen versus time according to an embodiment of the invention. The gas mixture having a composition including one or more organosilicon compounds and optionally one or more oxidizing gases is introduced into the chamber to deposit an initiation layer, as described above with respect to step 203 of FIG. 2. The initiation layer deposition may have a time range of between about 1 second and about 10 seconds.

The flow rate of the one or more organosilicon compounds is then increased at the ramp-up rate to deposit a first transition layer until reaching a predetermined organosilicon compound gas mixture, as described above with respect to step 205 of FIG. 2. The first transition layer deposition may have a time range of between about 1 second and about 10 seconds.

While keeping the predetermined organosilicon compound gas mixture constant, a gas mixture having a composition including one or more porogen compounds is introduced into the chamber, and the flow rate of the one or more porogen compounds is increased at a ramp-up rate to deposit a second transition layer until reaching a predetermined final gas mixture, as described above with respect to step 209 of FIG. 2. The second transition layer deposition may have a time range of between about 1 second and about 180 seconds.

The predetermined final gas mixture having a composition including the one or more organosilicon compounds and the porogen is reacted in the chamber in the presence of RF power to deposit a final layer that is a low dielectric constant film, as described above with respect to step 211 of FIG. 2. The final layer deposition may have a time range of between about 15 seconds and about 180 seconds.

It is believed that the initiation sequence for the deposition of the low dielectric constant film described above with respect to FIGS. 2 and 3 improves the adhesion of the low dielectric constant film to the underlying layer on the substrate on which it is deposited by providing improved control of the porosity and carbon content of the low dielectric constant film at the interface between the low dielectric constant film and the underlying layer.

Returning to step 106 of FIG. 1, during the reaction of the one or more organosilicon compounds and the porogen to deposit the low dielectric constant film on the substrate in the chamber, the substrate is typically maintained at a temperature between about 100° C. and about 400° C. The chamber pressure may be between about 1 Torr and about 20 Torr, and the spacing between a substrate support and the chamber showerhead may be between about 200 mils and about 1500 mils. A power density ranging between about 0.14 W/cm$^2$ and about 2.8 W/cm$^2$, which is a RF power level of between about 100 W and about 2000 W for a 300 mm substrate, may be used. The RF power is provided at a frequency between about 0.01 MHz and 300 MHz, such as about 13.56 MHz. The RF power may be provided at a mixed frequency, such as at a high frequency of about 13.56 MHz and a low frequency of about 350 kHz. The RF power may be cycled or pulsed to reduce heating of the substrate and promote greater porosity in the deposited film. The RF power may also be continuous or discontinuous.

After the low dielectric constant film is deposited, the film is post-treated, as described in step 108. Post-treatments that may be used include electron beam (e-beam) treatments, ultraviolet (UV) treatments, thermal annealing treatments (in the absence of an electron beam and/or UV treatment), and combinations thereof.

Exemplary UV post-treatment conditions that may be used include a chamber pressure of between about 1 Torr and about 10 Torr and a substrate support temperature of between about 350° C. and about 500° C. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. Further details of UV chambers and treatment conditions that may be used are described in commonly assigned U.S. patent application Ser. No. 11/124,908, filed on May 9, 2005, which is incorporated by reference herein. The NanoCure™ chamber from Applied Materials, Inc. is an example of a commercially available chamber that may be used for UV post-treatments.

Exemplary electron beam conditions that may be used include a chamber temperature of between about 200° C. and about 600° C., e.g. about 350° C. to about 400° C. The electron beam energy may be from about 0.5 keV to about 30 keV. The exposure dose may be between about 1° C./cm$^2$ and about 400° C./cm$^2$. The chamber pressure may be between about 1 mTorr and about 100 mTorr. The gas ambient in the chamber may be any of the following gases: nitrogen, oxygen, hydrogen, argon, a blend of hydrogen and nitrogen, ammonia, xenon, or any combination of these gases. The electron beam current may be between about 0.15 mA and about 50 mA. The electron beam treatment may be performed for between about 1 minute and about 15 minutes. Although any electron beam device may be used, an exemplary electron beam chamber that may be used is an EBk™ electron beam chamber available from Applied Materials, Inc. of Santa Clara, Calif.

An exemplary thermal annealing post-treatment includes annealing the film at a substrate temperature between about 200° C. and about 500° C. for about 2 seconds to about 3 hours, preferably about 0.5 to about 2 hours, in a chamber. A non-reactive gas such as helium, hydrogen, nitrogen, or a mixture thereof may be introduced into the chamber at a rate of about 100 to about 10,000 sccm. The chamber pressure is maintained between about 1 mTorr and about 10 Torr. The preferred substrate spacing is between about 300 mils and about 800 mils.

The following examples illustrate embodiments of the invention. The substrates in the examples were 300 mm substrates. The low dielectric constant films were deposited on the substrates in a PRODUCER® chamber available from Applied Materials, Inc. of Santa Clara, Calif. and UV treated in a NanoCure™ chamber available from Applied Materials, Inc. of Santa Clara, Calif.

EXAMPLE 1

A low dielectric constant film was deposited on a substrate at about 7.5 Torr and a temperature of about 300° C. The spacing was 300 mils, and the RF power was provided at 300 W at 13.56 MHz. The following processing gases and flow rates were used: bis(triethoxysilyl)methane at 2000 mgm, norbornadiene at 300 mgm, helium at 1500 sccm. The film was the post-treated with a UV treatment. After the post-treatment, the film had a refractive index of 1.3702, a dielectric constant of 2.44, an elastic modulus of 9.1 GPa, a hardness of 1.2 GPa, and a shrinkage of 9.8%.

EXAMPLE 2

A low dielectric constant film was deposited on a substrate at about 7.5 Torr and a temperature of about 225° C. The spacing was 400 mils, and the RF power was provided at 450 W at 13.56 MHz. The following processing gases and flow rates were used: bis(triethoxysilyl)methane at 500 mgm, alpha-terpinene at 2000 mgm, methyldiethoxysilane at 500 mgm, oxygen at 50 sccm, and helium at 3500 sccm. The film was the post-treated with a UV treatment. After the post-treatment, the film had a refractive index of 1.3443, a dielectric constant of 2.51, an elastic modulus of 11.1 GPa, a hardness of 1.6 GPa, and a shrinkage of 15.70%.

Figure 4:
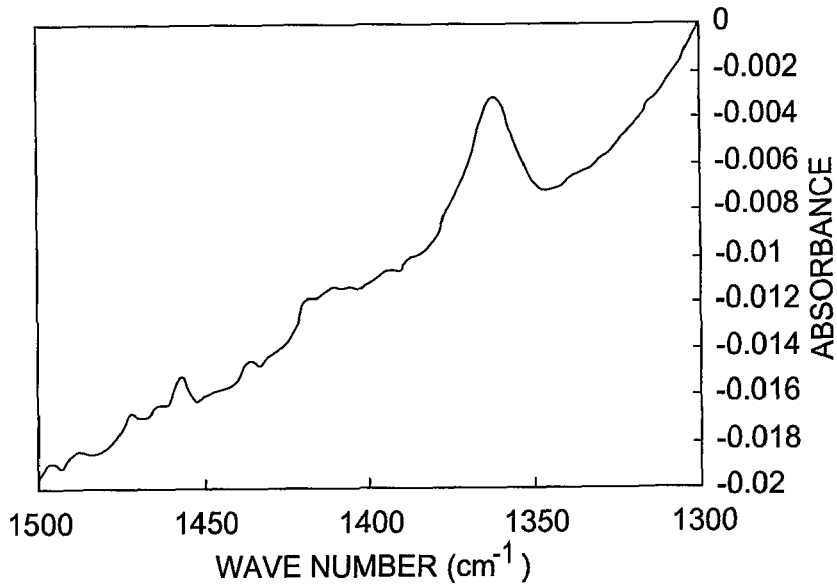
FIG. 4 is a FTIR of a post-treated low dielectric constant film provided according to embodiments of the invention.

FIG. 4 shows the results of FTIR analysis performed on the low dielectric constant film of Example 1 after the UV treatment. The FTIR analysis shows that the Si—C—Si bonding (Si—C—Si peak at 1630 cm$^{-1}$) provided by the organosilicon compound bis(triethoxysilyl)methane is preserved in the post-treated film, and thus, the post-treated film has a desirable Si—C—Si network structure.

It was also found that using precursors with Si—C—Si bonds to obtain films with higher Si—C—Si/SiCH$_3$ ratios also resulted in films having smaller pore sizes after post-treatment than other films have similar dielectric constants and lower Si—C—Si/SiCH$_3$ ratios. Films with smaller pore sizes are desirable as they are stronger and less likely to be damaged during further processing than films with larger pore sizes.

It is recognized that the organosilicon compounds provided herein can be used in gas mixtures that do not contain a porogen to chemically vapor deposit low dielectric constant films. However, while films deposited from gas mixtures that comprise the organosilicon compounds described herein and lack a porogen are expected to have improved mechanical properties compared to films deposited from porogen-free mixtures comprising other organosilicon compounds, typically, a porogen is included to provide the desired, lower dielectric constants of about 2.4 or less.

While the foregoing is directed to embodiments of the present invention, other and further embodiments of the invention may be devised without departing from the basic scope thereof, and the scope thereof is determined by the claims that follow.

What is claimed is:
1. A method of depositing a low dielectric constant film, comprising:
introducing one or more cyclic organosilicon compounds into a chamber, wherein the one or more cyclic organosilicon compounds comprises a Si—C$_x$—Si bond in the cyclic ring and a Si—O—Si bond in a cyclic ring, wherein x is 1 to 4;
introducing a cyclic porogen into the chamber;
reacting the one or more organosilicon compounds and the cyclic porogen in the presence of RF power to deposit a low dielectric constant film on a substrate in the chamber; and then
post-treating the low dielectric constant film to substantially remove the cyclic porogen from the low dielectric constant film.

2. The method of claim 1, wherein the one or more organosilicon compounds has the general structure:

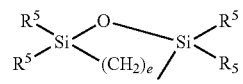

wherein each R$^5$ is independently selected from the group consisting of CH$_3$, OCH$_3$, OC$_2$H$_5$, H, and OH, and e is 1 to 3.

3. A method of depositing a low dielectric constant film, comprising:
introducing one or more organosilicon compounds into a chamber, wherein the one or more organosilicon compounds comprises a compound having the general structure:

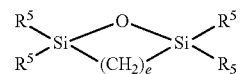

wherein each R$^5$ is independently selected from the group consisting of CH$_3$, OCH$_3$, OC$_2$H$_5$, H, and OH, and e is 1 to 3;
introducing a porogen into the chamber;
reacting the one or more organosilicon compounds and the porogen in the presence of RF power to deposit a low dielectric constant film on a substrate in the chamber; and then
post-treating the low dielectric constant film to substantially remove the porogen from the low dielectric constant film.

4. The method of claim 3, wherein the post-treated low dielectric constant film comprises Si—C$_x$—Si bonds, wherein x is 1 to 4.

5. The method of claim 3, wherein introducing the one or more organosilicon compounds into the chamber comprises introducing the one or more organosilicon compounds at a first flow rate and ramping up to a second flow rate, introducing the porogen into the chamber comprises introducing the porogen at a third flow rate and ramping up to a fourth flow rate, and the one or more organosilicon compounds are ramped up to the second flow rate before the porogen is ramped up to the fourth flow rate.

6. The method of claim 5, wherein the post-treating comprises a UV, e-beam, or thermal annealing treatment.

7. The method of claim 5, wherein the porogen comprises a cyclic hydrocarbon compound.

8. A method of depositing a low dielectric constant film, comprising:
introducing one or more cyclic organosilicon compounds into a chamber, wherein the one or more cyclic organosilicon compounds comprises a Si—C$_x$—Si bond in a cyclic ring and a Si—O—Si bond in the cyclic ring, wherein x is 1 to 4;

introducing a porogen selected from the group consisting of norbornadiene and alpha-terpinene into the chamber;

reacting the one or more organosilicon compounds and the porogen in the presence of RF power to deposit a low dielectric constant film on a substrate in the chamber; and then post-treating the low dielectric constant film to substantially remove the porogen from the low dielectric constant film.

9. The method of claim 8, wherein the porogen comprises norbornadiene.

10. The method of claim 9, wherein the post-treating comprises a UV treatment.

11. The method of claim 8, wherein the porogen comprises alpha-terpinene.

12. The method of claim 9, wherein the post-treating comprises a UV treatment.

13. The method of claim 11, wherein the one or more organosilicon compounds further comprises methyldiethoxysilane.

* * * * *

UNITED STATES PATENT AND TRADEMARK OFFICE
CERTIFICATE OF CORRECTION

| | | |
|---|---|---|
| PATENT NO. | : 7,998,536 B2 | Page 1 of 1 |
| APPLICATION NO. | : 11/777185 | |
| DATED | : August 16, 2011 | |
| INVENTOR(S) | : Yim et al. | |

It is certified that error appears in the above-identified patent and that said Letters Patent is hereby corrected as shown below:

Column 10, Claim 1, Line 1, delete "the" and insert --a-- therefor.

Column 10, Claim 1, Line 2, delete "a" and insert --the-- therefor.

Signed and Sealed this
Eighth Day of November, 2011

David J. Kappos
*Director of the United States Patent and Trademark Office*

UNITED STATES PATENT AND TRADEMARK OFFICE
CERTIFICATE OF CORRECTION

PATENT NO. : 7,998,536 B2
APPLICATION NO. : 11/777185
DATED : August 16, 2011
INVENTOR(S) : Yim et al.

It is certified that error appears in the above-identified patent and that said Letters Patent is hereby corrected as shown below:

Column 2, Lines 20-22, delete

" 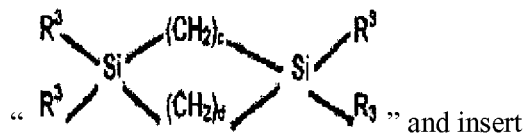 " and insert

-- 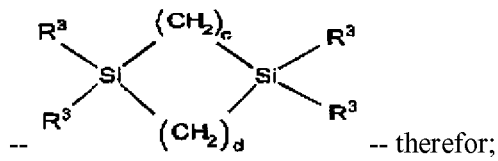 -- therefor;

Column 2, Lines 43-45, delete

" 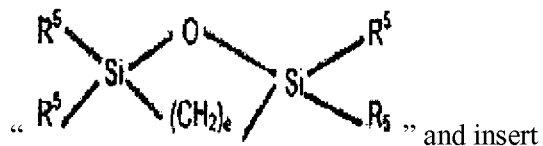 " and insert

-- 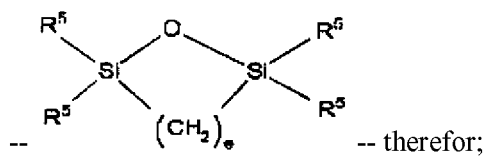 -- therefor;

Column 4, Lines 21-23, delete

" 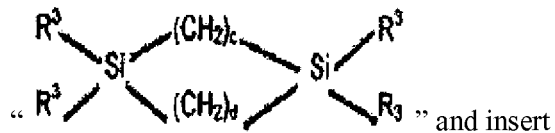 " and insert

Signed and Sealed this
Twenty-sixth Day of February, 2013

Teresa Stanek Rea
*Acting Director of the United States Patent and Trademark Office*

CERTIFICATE OF CORRECTION (continued)
U.S. Pat. No. 7,998,536 B2

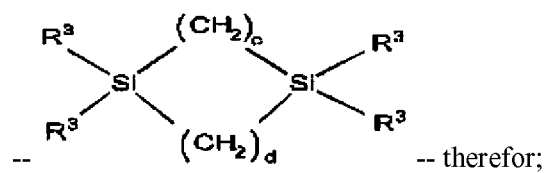 -- therefor;

Column 4, Lines 45-47, delete

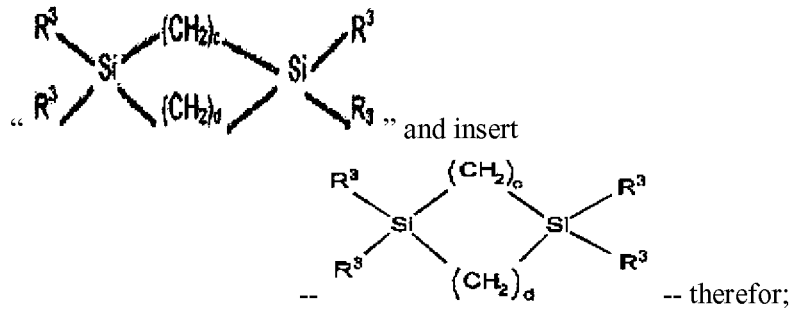 and insert -- therefor;

Column 4, Lines 55-57, delete

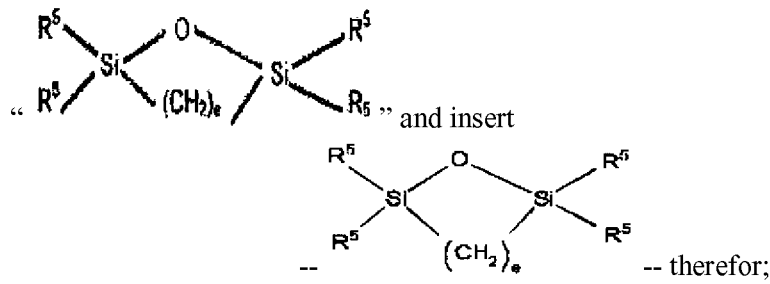 and insert -- therefor;

Column 10, Claim 2, Lines 16-18, delete

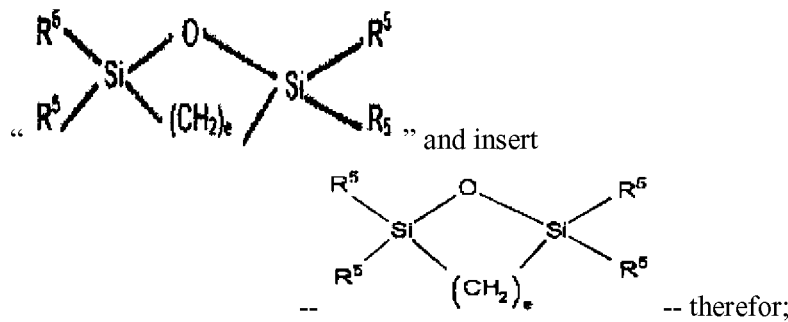 and insert -- therefor;

Column 10, Claim 3, Lines 31-33, delete

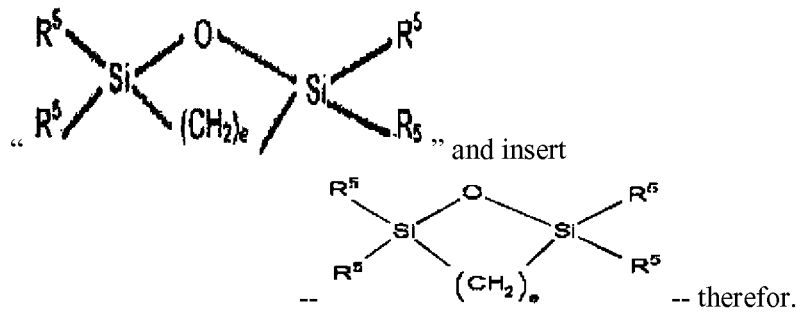 and insert -- therefor.